United States Patent
Mizuno et al.

(10) Patent No.: US 12,405,432 B2
(45) Date of Patent: Sep. 2, 2025

(54) MANUFACTURING METHOD OF OPTICAL MODULE

(71) Applicant: SUMITOMO ELECTRIC INDUSTRIES, LTD., Osaka (JP)

(72) Inventors: Yasutaka Mizuno, Osaka (JP); Munetaka Kurokawa, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 285 days.

(21) Appl. No.: 18/342,916

(22) Filed: Jun. 28, 2023

(65) Prior Publication Data

US 2024/0004149 A1  Jan. 4, 2024

(30) Foreign Application Priority Data

Jul. 4, 2022  (JP) .................................. 2022-107892

(51) Int. Cl.
  *G02B 6/42*  (2006.01)
  *B23K 11/06*  (2006.01)
  *H01S 5/022*  (2021.01)

(52) U.S. Cl.
  CPC .......... *G02B 6/4251* (2013.01); *B23K 11/061* (2013.01); *G02B 6/4237* (2013.01); *G02B 6/4268* (2013.01); *G02B 6/4272* (2013.01); *H01S 5/022* (2013.01)

(58) Field of Classification Search
  CPC .. G02B 6/4251; G02B 6/4237; G02B 6/4268; G02B 6/4272; G02B 6/4269; B23K 11/061; H01S 5/022
  See application file for complete search history.

(56) References Cited

U.S. PATENT DOCUMENTS 10,338,328 B2 *  7/2019  Carralero ............. G02B 6/4238

FOREIGN PATENT DOCUMENTS

| CN | 107219593 A | * | 9/2017 | |
| CN | 106078101 B | * | 11/2017 | |
| CN | 104942421 B | * | 5/2018 | ............. B23K 11/06 |
| JP | 2013-021220 A | | 1/2013 | |
| WO | WO-03044857 A1 | * | 5/2003 | ........... B32B 15/018 |

OTHER PUBLICATIONS

Bian, Machine Translation of CN-106078101-B, Nov. 21, 2017. (Year: 2017).*
Iiduka, Machine Translation of WO-03044857-A1, May 30, 2003. (Year: 2003).*
Hai, Machine Translation of CN 104942421 B, May 22, 2018. (Year: 2018).*
Li, Machine Translation of CN-107219593 A, Sep. 29, 2017. (Year: 2017).*

* cited by examiner

Primary Examiner — Michelle R Connelly
(74) Attorney, Agent, or Firm — MCDONALD HOPKINS LLC

(57) ABSTRACT

A manufacturing method of an optical module including a package and lid, the package having an opening to be sealed with the lid. The manufacturing method includes placing the lid on the package so that the lid covers the opening; putting a metal block on the lid, the metal block having a first surface touching a top surface of the lid; welding the lid to the package using a seam welding machine, the first surface of the metal block touching the top surface of the lid during the welding, the metal block being configured not to interfere the seam welding machine; and detaching the metal block from the lid.

6 Claims, 13 Drawing Sheets

MANUFACTURING METHOD OF OPTICAL MODULE

CROSS-REFERENCE TO RELATED APPLICATION

This application claims priority from Japanese Patent Application No. 2022-107892, filed on Jul. 4, 2022, the entire subject matter of which is incorporated herein by reference

TECHNICAL FIELD

The present disclosure relates to a method of manufacturing an optical module.

BACKGROUND

Japanese Unexamined Patent Publication No 2013-21220 describes an optical module including a ceramic package, a metal lid, and a sleeve. An optical element is mounted in a ceramic package. The lid covers an opening of the ceramic package. The sleeve is connected to the lid via a joint sleeve. The lid has a flat portion to be joined to the ceramic package and a cylindrical portion to which the joint sleeve is fitted. A stress relief portion is formed between the flat portion and the cylindrical portion.

The joining of the lid to the ceramic package is performed by seam welding. In the seam welding, a roller electrode for welding is pressed against a peripheral end of the flat portion of the metal lid. By pressing the roller electrode, a voltage is applied between the peripheral end portion of the flat portion and the metal seal ring to allow a current to flow, and thus, Joule heat is generated by contact resistance of a contact interface to heat. Due to the seam welding, the joint portion between the flat portion of the lid and the seal ring is heated to a high temperature of about 1000° C., and then cooled to room temperature of 25° C.

SUMMARY

A manufacturing method of an optical module including a package and lid, the package having an opening to be sealed with the lid. The manufacturing method includes placing the lid on the package so that the lid covers the opening; putting a metal block on the lid, the metal block having a first surface touching a top surface of the lid; welding the lid to the package using a seam welding machine, the first surface of the metal block touching the top surface of the lid during the welding, the metal block being configured not to interfere the seam welding machine; and detaching the metal block from the lid.

DETAILED DESCRIPTION

Details of Embodiment of Present Disclosure

Figure 1:
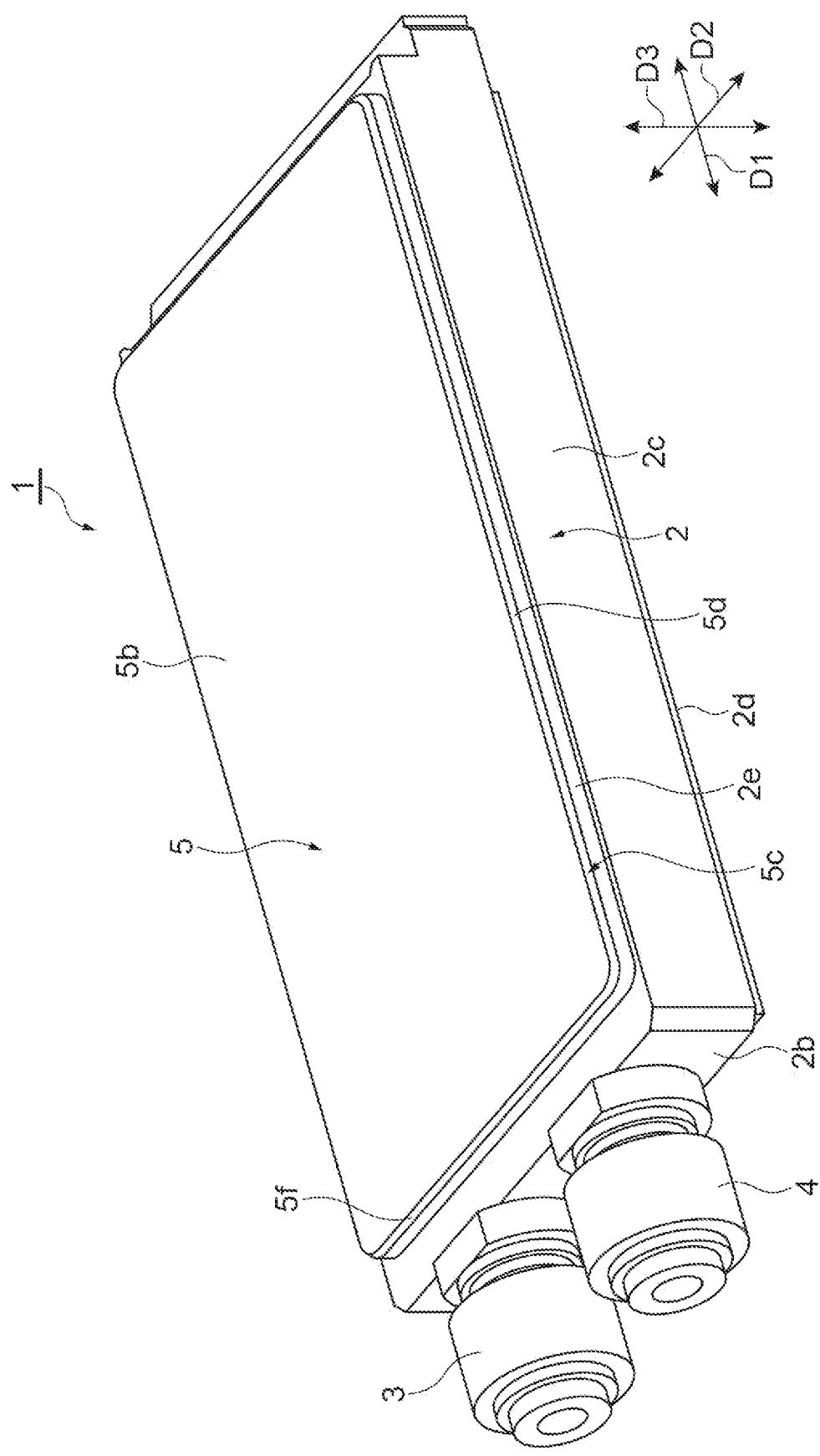
FIG. 1 is a perspective view illustrating an optical module according to an embodiment.

A specific example of a method of manufacturing an optical module according to an embodiment will be described below with reference to the drawings. It is noted that the present invention is not limited to the following examples, but is intended to include all modifications indicated in the scope of the claims and within the scope of equivalents to the scope of the claims. In the description of the drawings, the same or corresponding elements are denoted by the same reference numerals, and overlapping descriptions are omitted as appropriate. The drawings may be partially simplified or exaggerated for easy understanding, and the dimensional ratios and the like are not limited to those described in the drawings.

Figure 2:
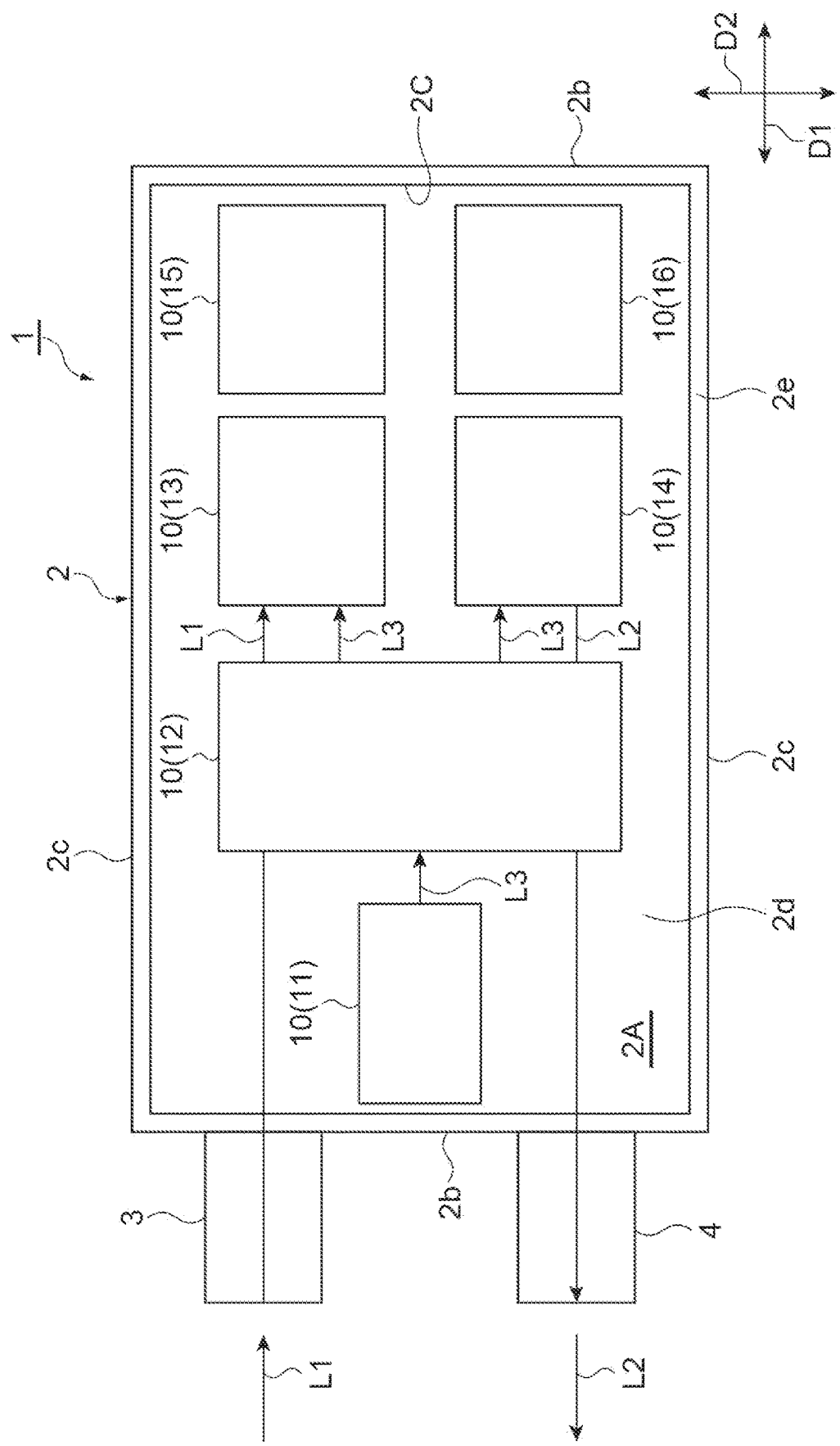
FIG. 2 is a plan view schematically illustrating an internal structure of the optical module of FIG. 1.

FIG. 1 is a perspective view illustrating an optical module 1 as a specific example to which the manufacturing method according to this embodiment is applied. FIG. 2 is a plan view schematically illustrating an internal structure of the optical module 1. As illustrated in FIGS. 1 and 2, the optical module 1 includes a rectangular parallelepiped package 2, a first optical receptacle 3, a second optical receptacle 4, and a lid 5. FIG. 2 is a plan view schematically illustrating a state in which the lid 5 is removed from the optical module 1.

The package 2 is made of, for example, at least one of hermetically-sealed materials such as ceramic, glass, and metal. In this embodiment, the package 2 is made of ceramic. The package 2 extends in a direction D1 that is a longitudinal direction of the package 2, a direction D2 that is a width direction of the package 2, and a direction D3 that is a height direction of the package 2. For example, the direction D1, the direction D2, and the direction D3 are orthogonal to each other. For example, the length (height) of the package 2 in the direction D3 is ⅓ or less of the length of the package 2 in the direction D1. The length (width) of the package 2 in the direction D2 is shorter than the length of the package 2 in the direction D1. In a planar view of the package 2 from the direction D3, the direction along the long sides corresponds to the longitudinal direction, and the direction along the short sides corresponds to a transverse direction.

The package 2 includes a pair of first side walls 2b positioned at the end portions in the direction D1, a pair of second side walls 2c positioned at the end portions in the direction D2, and a bottom wall 2d positioned at the end portion in the direction D3 and mounted with a plurality of components 10 of the optical module 1. An internal space 2A of the package 2 is defined in a space surrounded by the pair of first side walls 2b, the pair of second side walls 2c, and the bottom wall 2d. The plurality of components 10 of the optical module 1 are accommodated in the internal space 2A.

The first optical receptacle 3 and the second optical receptacle 4 are aligned, for example, along the direction D2. The first optical receptacle 3 and the second optical receptacle 4 pass through one of the first side walls 2b in the direction D1. The plurality of components 10 include, for example, a variable wavelength laser 11, an internal optical system 12, an optical reception unit 13, an optical transmission unit 14, a trans impedance amplifier (TIA) 15, and a driver 16. The internal optical system 12 includes a plurality of optical components. For example, the internal optical system 12 includes at least one of lenses, mirrors, beam splitters, and optical filters.

For example, an optical signal L1 is input into the first optical receptacle 3 from the outside of the optical module 1. The optical signal L1 is input into the internal space 2A of the optical module 1 via the first optical receptacle. The variable wavelength laser 11 outputs continuous wave laser (CW) light L3 to the internal optical system 12. In the internal optical system 12, positions and angles of the respective optical components are adjusted so that a predetermined coupling efficiency can be obtained for an optical path between the plurality of components of the internal optical system 12 by aligning the respective optical components in accordance with the positions of the variable wavelength laser 11, the optical reception unit 13, and the optical transmission unit 14. For example, the internal optical system 12 outputs the optical signal L1 to the optical reception unit 13, divides the CW light L3 into two, and outputs the CW lights L3 to the optical reception unit 13 and the optical transmission unit 14, respectively. The optical reception unit 13 includes, for example, an optical 90° hybrid and a photo diode (PD). One of the optical signal L1 and the two split CW lights L3 is input into the optical 90° hybrid. The optical 90° hybrid outputs an optical signal generated from the optical signal L1 and the CW light L3 to the PD. The PD generates a received signal according to the optical signal output from the optical 90° hybrid. The received signal (for example, photocurrent) generated by the PD is transmitted to the TIA 15. The driver 16 supplies, for example, an electrical signal (driving signal) to the optical transmission unit 14. The optical transmission unit 14 converts the electrical signal received from the driver 16 into an optical signal L2 and outputs the optical signal L2 to the internal optical system 12. The optical transmission unit 14 includes, for example, an optical modulator. The optical modulator modulates the other of the two split CW lights L3 according to the electrical signal to generate the optical signal L2. The internal optical system 12 outputs the optical signal L2 from the optical transmission unit 14 to the outside of the optical module 1 via the second optical receptacle 4.

The package 2 has an opening 2C facing the side opposite to the bottom wall 2d in the direction D3. The internal space 2A is formed inside the opening 2C, and the plurality of components 10 described above are accommodated in the opening 2C. For example, the plurality of components 10 are arranged in the internal space 2A via the opening 2C. For example, the internal optical system 12 is mounted on the bottom wall 2d in the internal space 2A. The lid 5 is made of, for example, metal. As an example, the lid 5 is made of Kovar. In addition, the lid 5 may be made of an alloy of nickel and gold. The lid 5 has a rectangular shape. The lid 5 has, for example, a flat plate shape. As an example, the lid 5 has a thickness (length in the direction D3) of 0.1 mm. The lid 5 has, for example, a top surface 5b extending in both directions D1 and D2 and a side surface 5c intersecting with the top surface 5b. For example, the side surface 5c includes a first side surface 5d extending in the direction D1 and a second side surface 5f extending in the direction D2.

Figure 3:
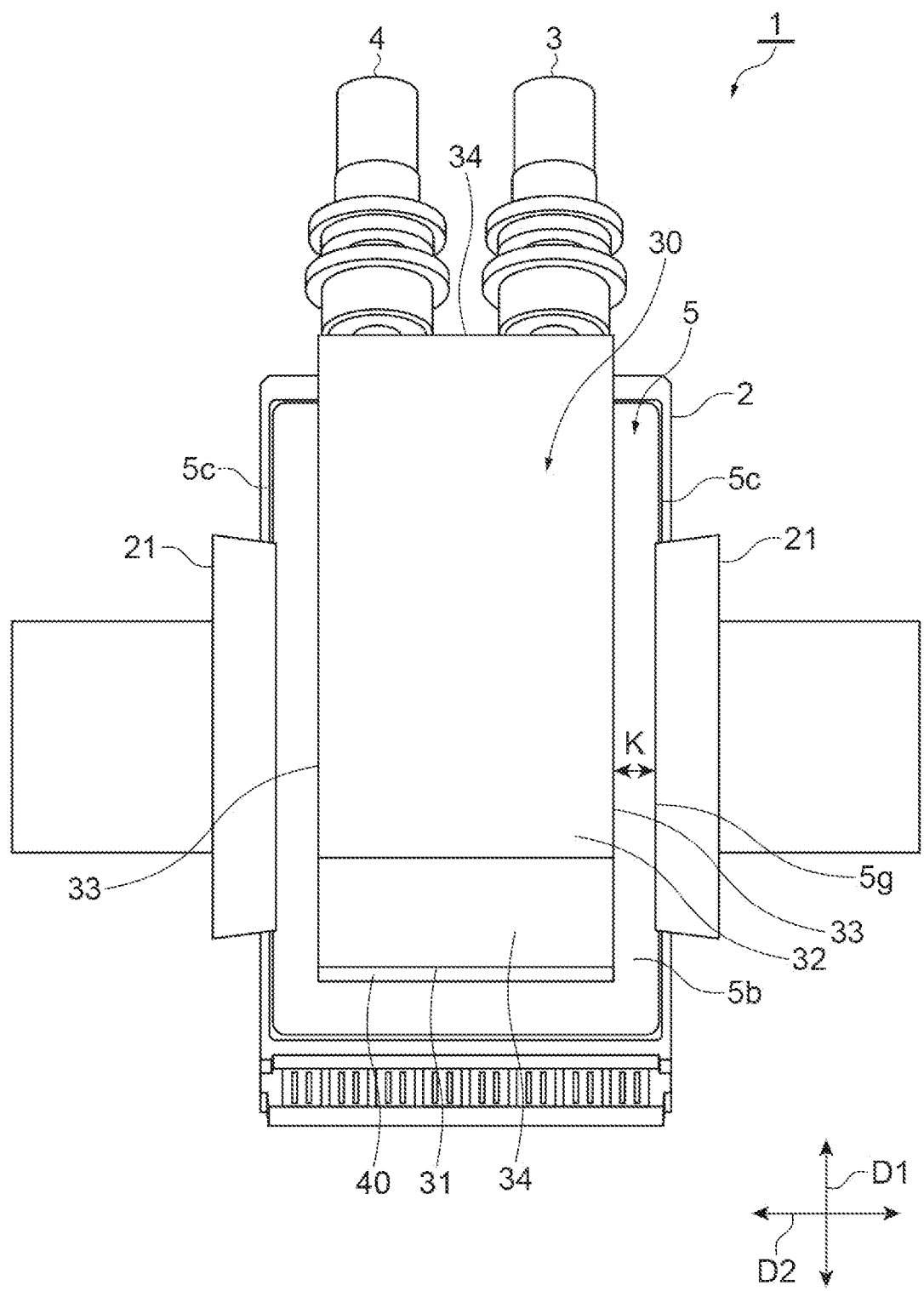
FIG. 3 is a perspective view illustrating a roller electrode and a metal block used in a method of manufacturing an optical module according to the embodiment.

The lid 5 is joined to the package 2 so as to close the opening 2C to hermetically seal the internal space 2A. In the package 2, a metal seal ring 2e is joined to the upper portions of the first side wall 2b and the second side wall 2c so as to surround the opening 2C, and the lid 5 is joined to the package 2 via the seal ring 2e. The joining of the lid 5 to the package 2 is performed by the seam welding. FIG. 3 is a perspective view illustrating a state in which the seam welding is performed on the lid 5 and the package 2. The seam welding is performed by moving a roller electrode 21 in the direction D1 or the direction D2 in a state in which the roller electrode 21 for welding presses the lid 5 against the seal ring 2e in the direction D3. Specifically, by allowing one of the roller electrodes 21 to be in contact with one end of the lid 5 in the direction D2 and allowing the other of the roller electrodes 21 to be in contact with the other end of the lid 5 in the direction D2, a voltage is applied to the roller electrodes 21 to be moved along the direction D1 while rotating respectively. At this time, a voltage is applied between the lid 5 pressed by the roller electrode 21 and the seal ring 2e to allow a current to flow, so that the Joule heat is generated by the contact resistance of the contact interface of the lid 5 and the seal ring 2e. This Joule heat heats and melts the nickel (Ni) plating or the nickel (Ni)/gold (Au) plating applied to the lid 5 and the seal ring 2e to form an Au brazing material, and the lid 5 is joined to the package 2. The joint portion extends from one end to the other end of the lid 5 in the direction D1 along with the movement of the roller electrodes 21, and thus, the two long sides of the lid 5 are joined. The two long sides are placed along the direction D2. Similarly, the two short sides of the lid 5 are also joined together by moving the roller electrodes 21 along the direction D2 while applying an electric current. The two short sides are placed along the direction D1.

In the seam welding described above, the joint portion between the lid 5 and the seal ring 2e is heated to a high temperature of about 1000° C. Specifically, in the case of the lid 5 made of an alloy of nickel and gold, the joint portion is heated to a melting point of 960° C. or higher, and then cooled to room temperature (for example, 25° C.) after the seam welding. At this time, for example, the Joule heat is transferred to the surroundings to raise the temperature of the entire lid 5, and the lid 5 is joined to the seal ring 2e in a thermally expanded state. After that, when the lid 5 is cooled to room temperature, the residual stress may be generated in the lid 5 due to the thermal contraction of the lid 5. The residual stress may deform the package 2 and cause the package 2 to warp. For example, when the components constituting the internal optical system 12 in the internal space 2A are fixed to the bottom wall 2d, the relative position between the components and the orientations of each component may be changed due to the warping of the bottom wall 2d. Therefore, due to the influence of the deformation (distortion) of the package 2, the coupling efficiency of the optical signal may be reduced in the internal optical system 12 described above. In addition, in this embodiment, there may be a problem that the coupling efficiency of the internal optical system 12 configured in the internal space 2A cannot be adjusted after the package 2 is hermetically sealed. When the coupling efficiency of the optical signal is reduced, there is a possibility that, for example, the output power of the optical signal L2 may be reduced.

Figure 4:
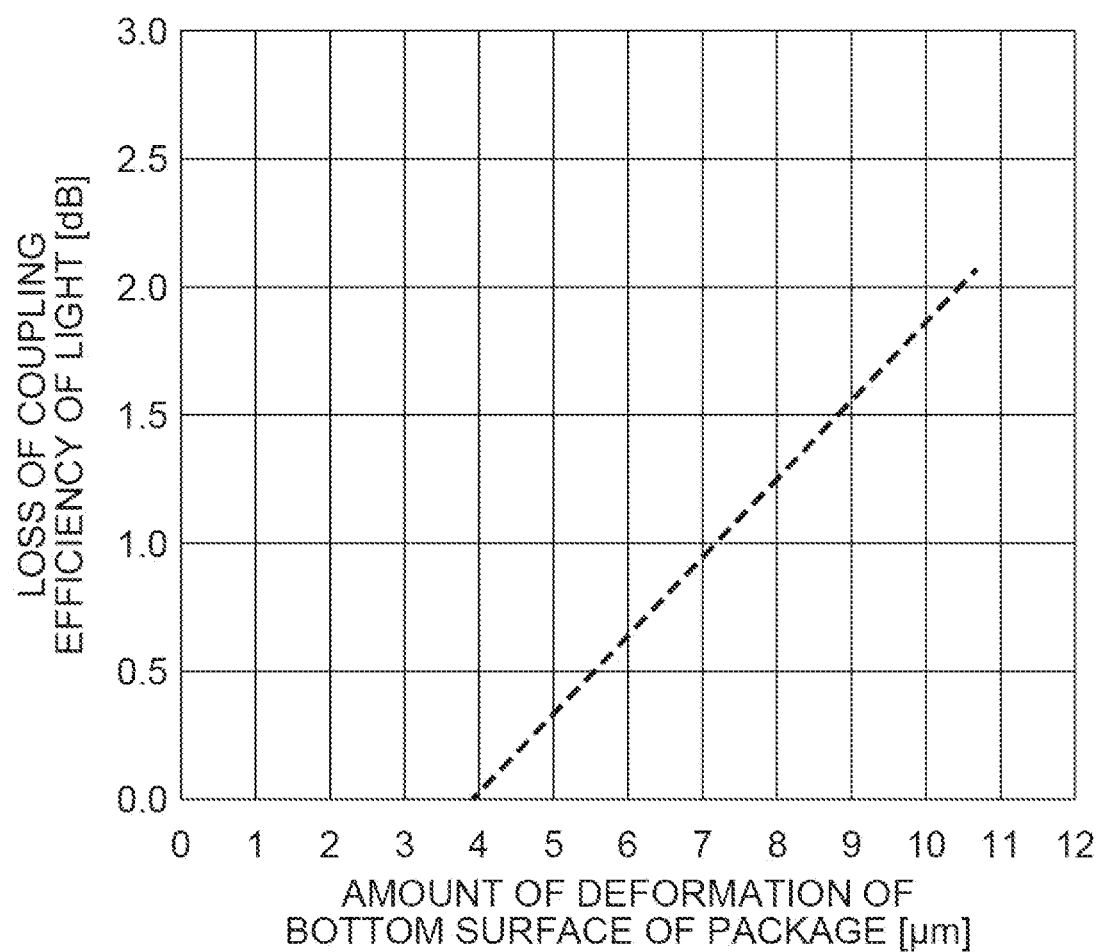
FIG. 4 is a graph illustrating an example of a relationship between deformation of a bottom surface of a package and a coupling loss of an optical signal.

FIG. 4 is a graph illustrating a relationship between an amount of deformation of the bottom surface (bottom wall 2d) of the package 2 and a loss of coupling efficiency of the optical signal. The amount of deformation corresponds to the distance (height difference) between the highest portion and the lowest portion in the direction D3 when the bottom surface is warped in the direction D3. For the coupling efficiency, when the amount of deformation is zero, the value of the output power of the optical signal L2 is taken as a reference value of 0 dB. As illustrated in FIG. 4, when the amount of deformation of the bottom wall 2d of the package 2 exceeds 4 μm, loss of light coupling efficiency may occur. Therefore, in order not to cause the coupling loss of an optical signal to occur, it is desirable that the amount of deformation of the bottom wall 2d of the package 2 is 4 μm or less. It is noted that it is possible to suppress the amount of deformation of the package 2 by reducing the thermal expansion of the lid 5 by reducing the temperature of the joint portion of the lid 5 during the seam welding. However, in the method of lowering of the temperature of the joint portion of the lid the welding between the lid 5 and the seal ring 2e may be insufficient, and thus, there is a possibility that leaks occurs and the hermetically-sealing as described above is incomplete. In this embodiment, it is possible to suppress the occurrence of the leakage and suppress the amount of deformation of the package 2 to be described later.

As illustrated in FIG. 3, in the method of manufacturing the optical module 1 according to this embodiment, a metal block 30 is placed on the lid 5 before the seam welding. Since the metal block 30 is placed to be in contact with the top surface 5b of the lid 5 when the joint portion is heated, the Joule heat can escape from the top surface 5b of the lid 5 to the metal block 30, and thus, it is possible to suppress the portions other than the joint portion of the lid 5 from being heated. In other words, since the welding is performed by heating the joint portion of the lid 5 to the melting point or higher, and the temperature rise in the portions other than the joint portion of the lid 5 can be suppressed, so that the residual stress of the lid 5 can be reduced. Therefore, the deformation of the package 2 due to the thermal contraction of the lid 5 can be avoided, and the warping of the package 2 can be difficult to be generated, the decrease in coupling efficiency of the optical signal due to the seam welding can be reduced. It is noted that, although the first optical receptacle 3 and the second optical receptacle 4 are illustrated in FIG. 3, when the lid 5 is seam-welded to the package 2, the first optical receptacle 3 and the second optical receptacle 4 may not be connected to the package 2 and may not be arranged at the position illustrated in FIG. 3. For example, after the lid 5 is joined to the package 2 to be hermetically sealed, the first optical receptacle 3 and the second optical receptacle 4 may be attached to the package 2 while being aligned.

In this embodiment, the metal block 30 is, for example, a copper block made of copper. As an example, the metal block 30 is made of oxygen-free copper. The metal block 30 is preferably made of a metal material having a thermal conductivity higher than that of the lid 5. Since the heat is more easily transferred to the copper block 30 than to the lid 5, the temperature rise in the portions other than the joint portion of the lid 5 can be effectively suppressed. The metal block 30 has, for example, a rectangular parallelepiped shape. The metal block 30 has a first surface 31 facing the lid 5 side, a second surface 32 facing the side opposite to the first surface 31, a pair of third surfaces 33 facing the pair of roller electrodes 21, respectively, and a pair of fourth surfaces 34 facing in the direction D1. The first surface 31 corresponds to the bottom surface of the metal block 30, and the second surface 32 corresponds to the top surface of the metal block 30. The third surface 33 corresponds to the side surface of the metal block 30 facing the direction D2, and the fourth surface 34 corresponds to the side surface of the metal block 30 facing the direction D1. For example, the metal block 30 is placed on the top surface 5b of the lid 5 via a heat dissipation member 40. At this time, the first surface 31 is in contact with the heat dissipation member 40. The heat dissipation member 40 is, for example, a heat dissipation sheet having a sheet shape extending in both the direction D1 and the direction D2. In order to conduct heat from the lids 5 to the metal block the heat dissipation sheet is flexible and closely adheres to the first surface 31 of the metal block 30 and the top surface 5b of the lid 5, and thus, the heat dissipation sheet is preferably thin. It is noted that the heat dissipation member 40 may be a heat dissipation gel. The metal block 30 is placed, for example, on the top surface 5b of the lid 5 along the direction D3. As will be described later, the metal block 30 is placed on the top surface 5b of the lid 5 before the seam welding and removed from the top surface 5b of the lid 5 along the direction D3 after the seam welding. A projection (handle) may be provided on the second surface 32. Since the handle is provided, the operator can easily perform the work by handling the metal block 30 with the handle. Alternatively, the package 2 may be fixed by a jig, and the metal block 30 may be fixed by the jig so as not to move in the direction D1 or the direction D2 during the seam welding with respect to the fixed package 2.

Figure 5:
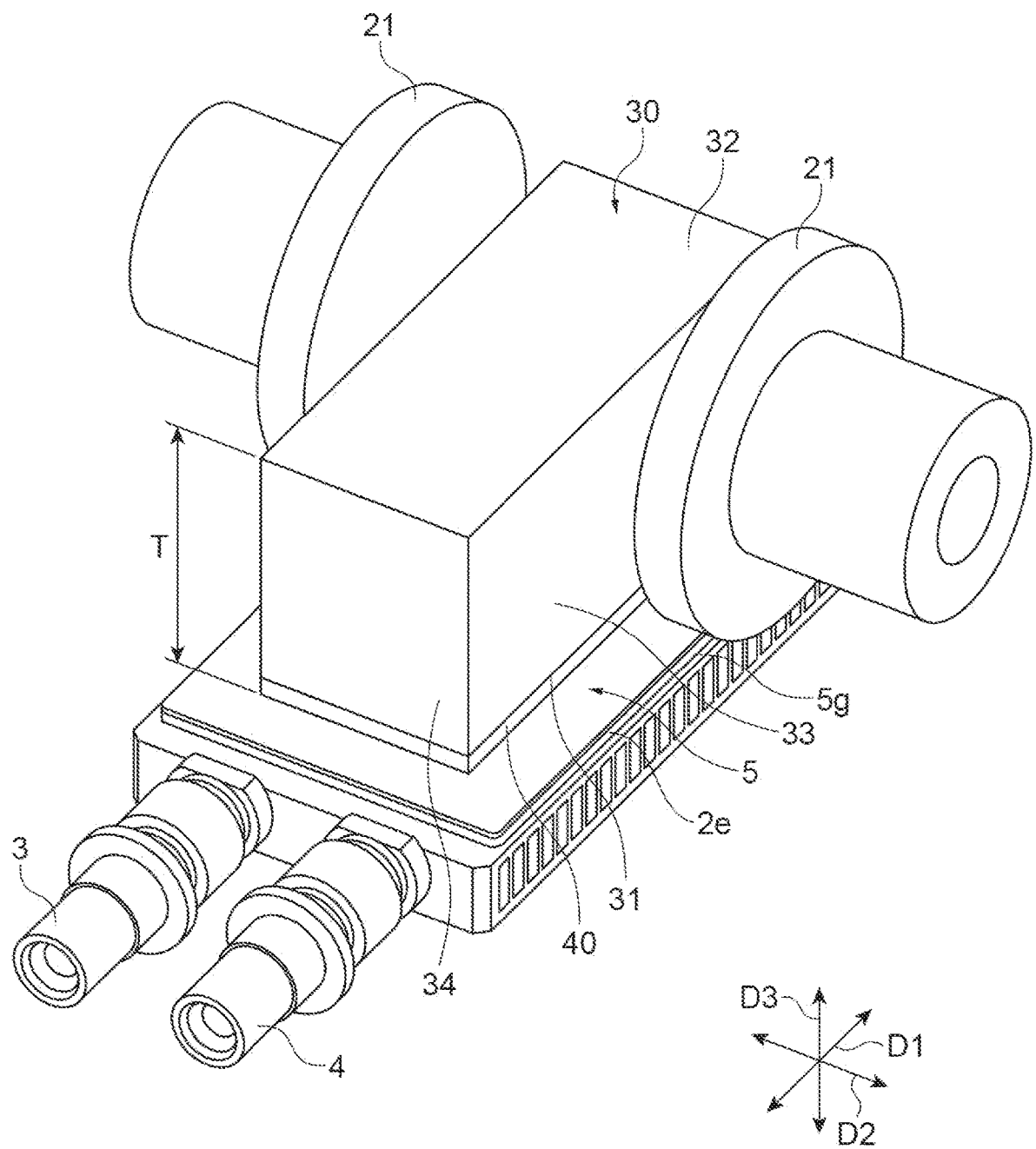
FIG. 5 is a perspective view illustrating roller electrodes, metal blocks, and an optical module.

As described above, the seam welding is performed with the roller electrodes 21 for welding pressing both ends of the lid 5 against the seal ring 2e. FIG. 5 is a perspective view illustrating a state of the seam welding. As illustrated in FIGS. 3 and 5, the seam welding produces a joint portion 5g between the lid 5 and the seal ring 2e. A distance K from the metal block 30 to the joint portion 5g when viewed from the direction D3 that is a thickness direction of the lid 5 (planar view from the direction D3) is, for example, 0.8 mm or more and 3 mm or less. As illustrated in FIG. 3, the distance K may be considered to correspond to, for example, a distance between the third surface 33 of the metal block and the roller electrode 21 during the welding. Since the seal ring 2e is melted to form the joint portion 5g with the lid 5, it may be considered that the shape of the joint portion 5g formed by the seam welding is the same as the shape of the seal ring 2e in a planar view from the direction D3.

Figure 6:
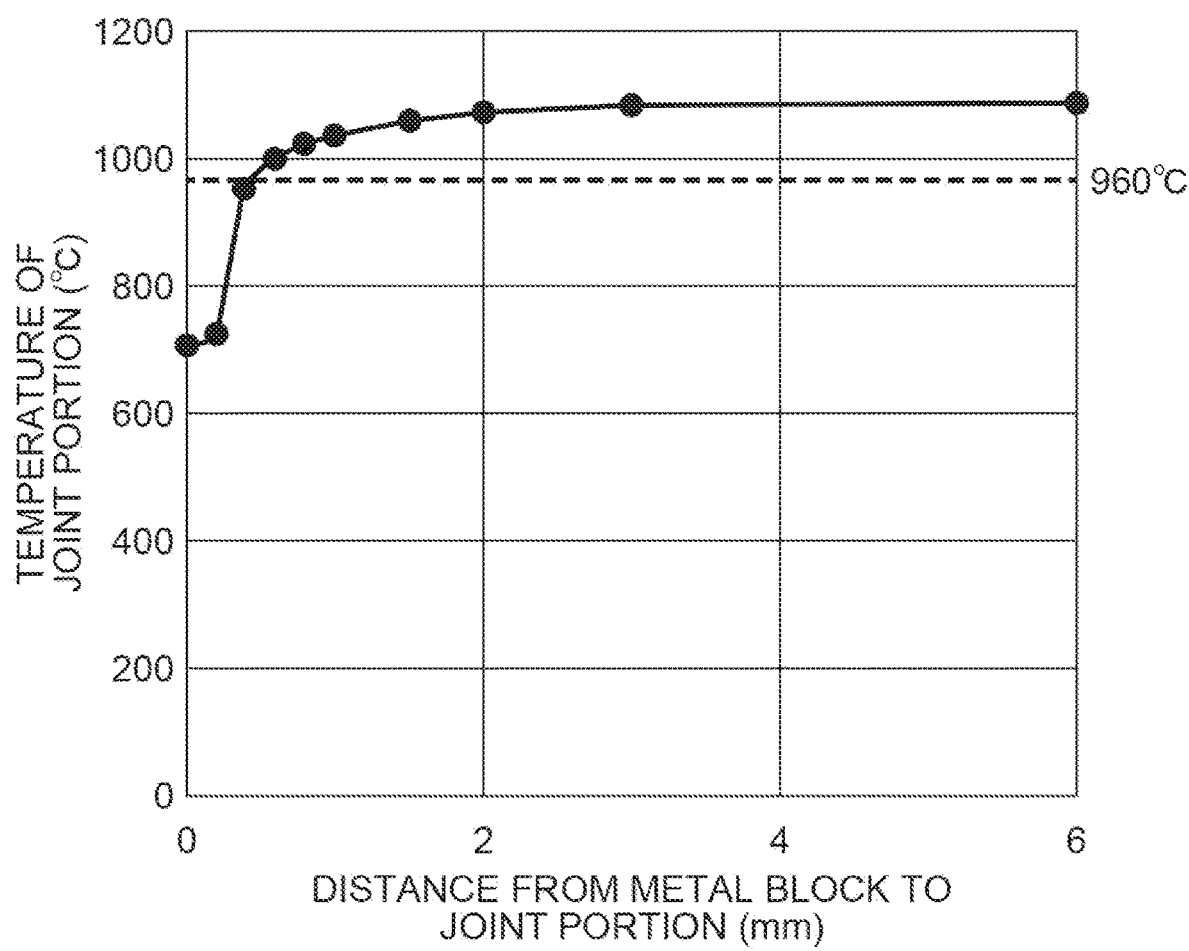
FIG. 6 is a graph illustrating an example of a relationship between a distance from the metal block to a joint portion and temperature of the joint portion during seam welding.
Figure 7:
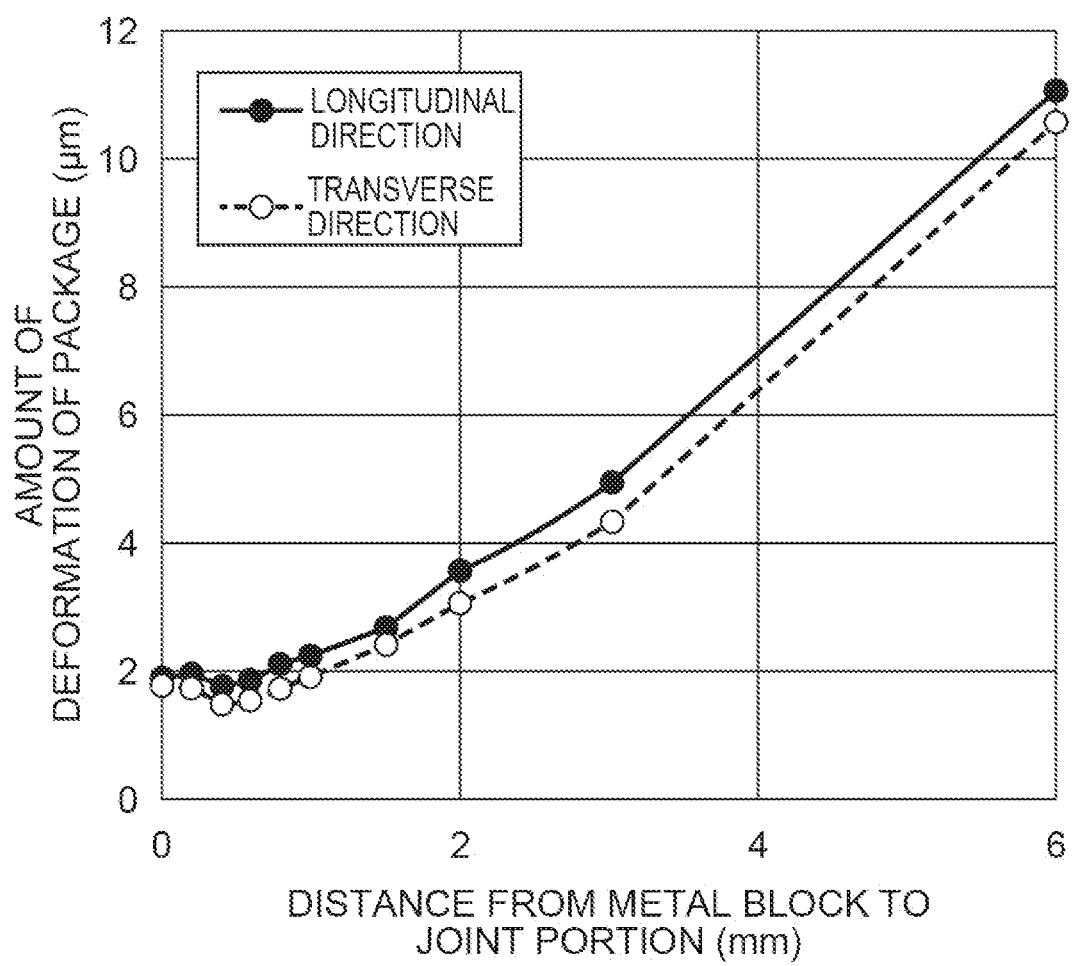
FIG. 7 is a graph illustrating an example of a relationship between a distance from the metal block to the joint portion and an amount of deformation of the package before and after the seam welding.
Figure 9:
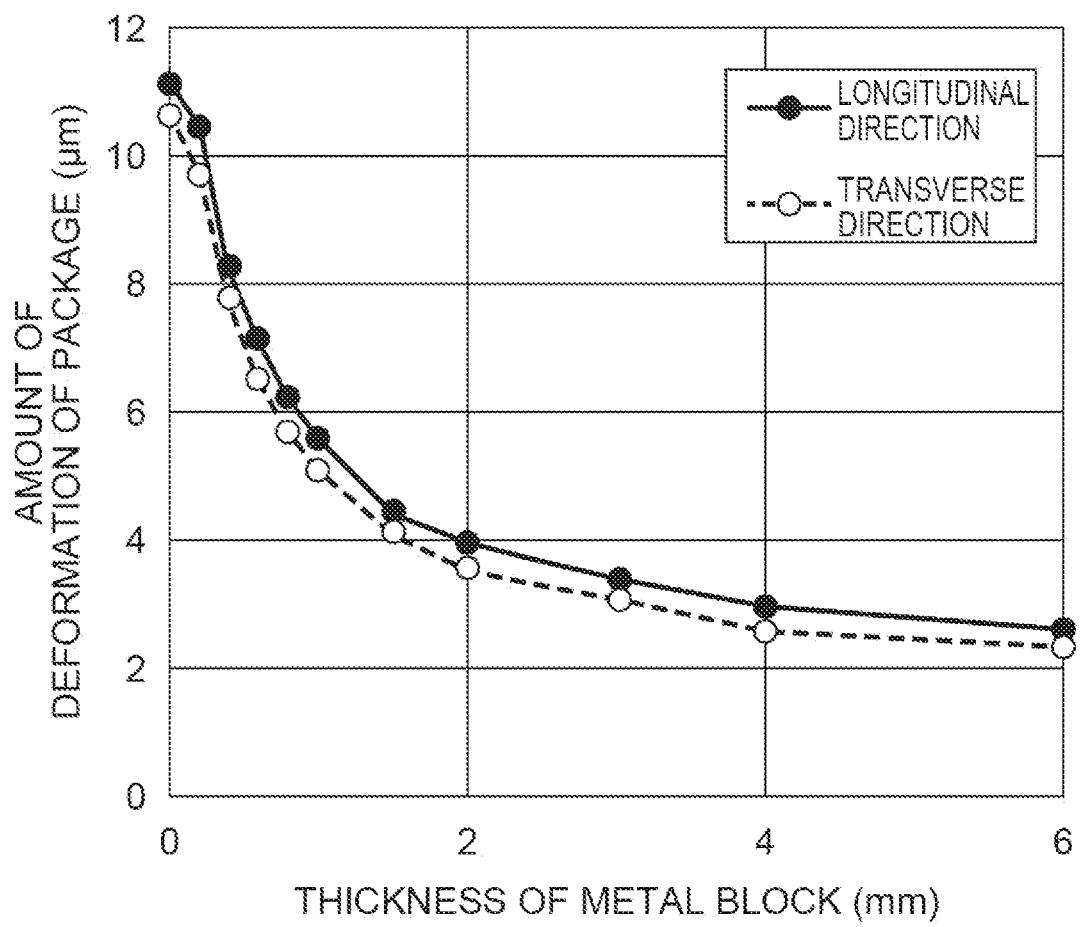
FIG. 9 is a graph illustrating an example of a relationship between a thickness of the metal block and an amount of deformation of the package before and after the seam welding.

FIG. 6 is a graph illustrating a relationship between the distance K from the metal block 30 to the joint portion 5g and the temperature of the joint portion 5g during the joining FIG. 7 is a graph illustrating a relationship between the distance K and the amount of deformation of the package 2. In FIGS. 7 and 9, the "longitudinal direction" indicates deformation (warp) in the longitudinal direction (direction D1) of the package 2 in the direction D3, and the "transverse direction" indicates deformation in the transverse direction (direction D2) of the package 2. As illustrated in FIG. 6, when the distance K is less than 0.6 mm, too much Joule heat escapes from the portion where the roller electrode 21 is in contact with the lid 5 to the metal block 30, and there is a possibility that the temperature of the joint portion 5g does not rise to the melting point (for example, 960° C.), the welding may escape and the roller electrode 21 may be in contact with the metal block 30. When the distance K is 0.8 mm or more, the contact of the roller electrode 21 with the metal block 30 can be suppressed, and the temperature of the joint portion 5g is the melting point or higher, so that the welding can be reliably performed. When the distance K exceeds 3 mm, the heat conduction of the Joule heat to the metal block 30 becomes relatively small, there is a possibility that the temperature of the entire lid 5 rises, and the residual stress of the package 2 is increased to deform the package 2. On the other hand, when the distance K is 3 mm or less, the heat conduction of the Joule heat to the metal block 30 becomes quick and relatively increased, so that the amount of deformation of the package 2 can be suppressed to 4 μm or less.

The heat capacity of the metal block 30 is larger than that of the lid 5. In order to suppress an excessive temperature rise of the entire lid during the welding, it is desirable that the heat capacity of the metal block 30 is a certain value or more. For example, since the Joule heat generated during the seam welding is conducted to the metal block 30 and consumed to raise the temperature of the metal block 30, the temperature rise of the lid 5 is suppressed in comparison with the case of the lid 5 alone (that case where the metal block 30 is not placed). It is noted that the thermal conductivity of the metal block 30 is preferably higher than that of the lid 5. The higher the thermal conductivity of the metal block 30 is, the more easily the heat is transferred from the lid 5 to the metal block 30. In addition, it is preferable that the heat capacity of the metal block 30 is large. When the heat capacity of the metal block 30 is large, the heat transmitted to the metal block 30 is consumed to heat the metal block 30, so that the temperature of the portion of the lid 5 in contact with the metal block 30 is less likely to rise. The heat capacity of the metal block 30 is proportional to the volume of the metal block 30. The area of the first surface 31 of the metal block 30 is restricted by the distance K described above. Therefore, in order to set the heat capacity of the metal block 30 to a certain value or more, it is desirable to set the thickness T (refer to the length in the direction D3, in FIG. 5) of the metal block 30 to a predetermined value or more. For example, the thickness T of the metal block 30 is 2 mm or more and 10 mm or less. As an example, the length of the metal block 30 in the direction D1 (the length of the long side of the metal block 30) is 20 mm, and the length of the metal block 30 in the direction D2 (the length of the short side of the metal block 30) is 10 mm. In this case, the volume of the metal block 30 is between 0.4 cm$^3$ and 2 cm$^3$. As an example, the density of the metal block 30 is about 9 g/cm$^3$, and the weight of the metal block 30 is about 18 g. In addition, the specific heat of the metal block 30 is 385 J/kg° C., and the heat capacity of the metal block 30 is about 7 J/° C.

Figure 8:
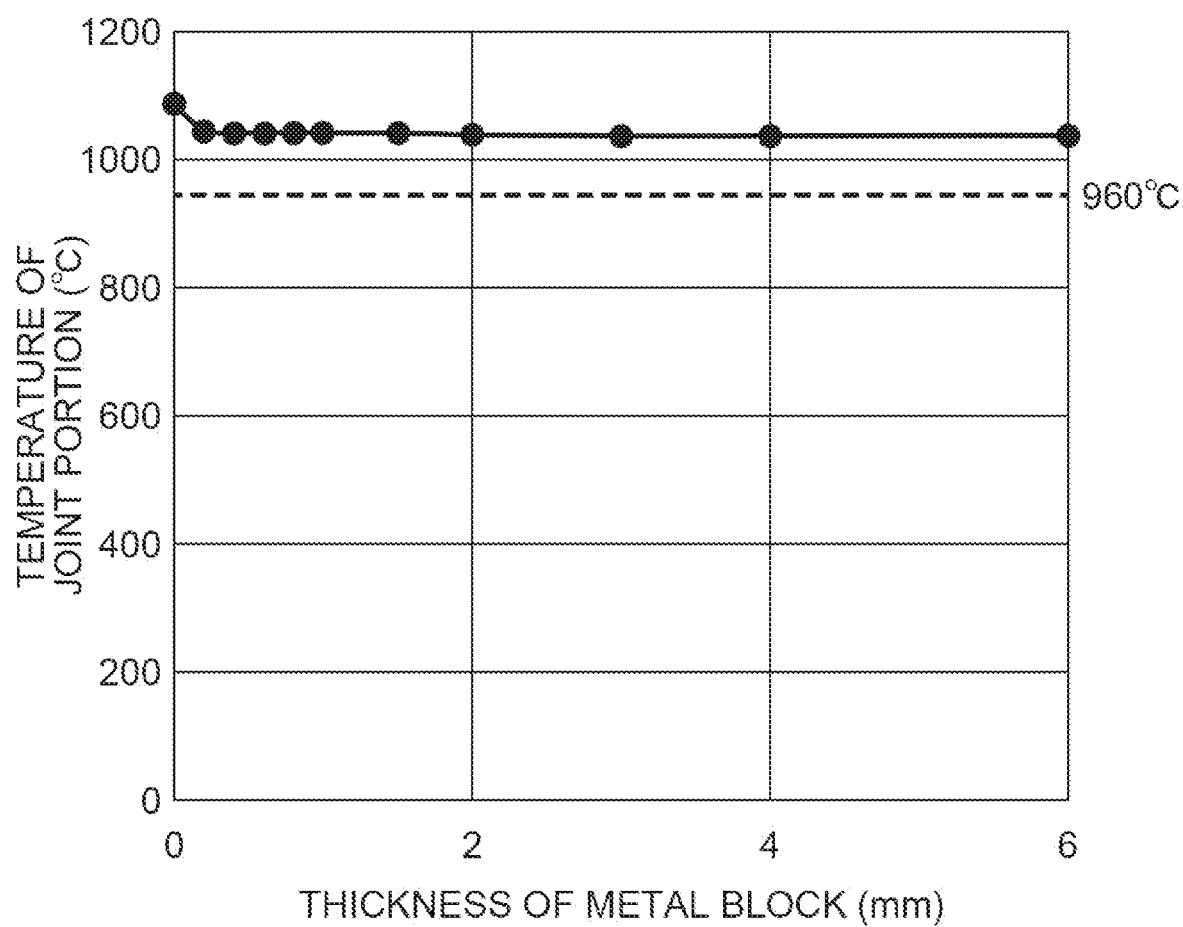
FIG. 8 is a graph illustrating an example of a relationship between a thickness of the metal block and temperature of the joint portion during the seam welding.

FIG. 8 is a graph illustrating a relationship between the thickness T of the metal block 30 and the temperature of the joint portion 5g. FIG. 9 is a graph illustrating a relationship between the thickness T and the amount of deformation of the package 2. As illustrated in FIGS. 8 and 9, when the thickness T is small (for example, 0.5 mm), the temperature of the portions other than the joint portion 5g becomes too high, and thus, the amount of deformation of the package 2 exceeds 4 μm. On the other hand, when the thickness T is 2 mm or more, since the metal block 30 can sufficiently suppress the temperature rise in the inner portion of the joint portion of the lid 5, the amount of deformation of the package 2 can be suppressed to 4 μm or less due to the reduction in the residual stress after cooling to room temperature.

However, the value of the thickness T effective for suppressing the temperature rise of the lid 5 due to the metal block 30 depends on the size (capacity) of the lid 5 and the welding conditions (for example, the moving speed of the roller electrode 21, the heating time, or the like). The thickness (the length in the direction D3) of the lid 5 is, for example, 0.1 mm or more (0.3 mm as an example). In addition, the length (the length of the long side of the lid 5) of the lid 5 in the direction D1 is 20 mm or more (24.1 mm as an example), and the length (the length of the short side of the lid 5) of the lid 5 in the direction D2 is 10 mm or more (14.1 mm as an example). For example, a volume of the lid 5 is about 0.1 cm$^3$. As an example, a density of the lid 5 is 8 g/cm$^3$, and a weight of the lid 5 is about 0.8 g. In addition, the specific heat of the lid 5 is 460 J/kg° C., and the heat capacity of the lid 5 is about 0.4 J/° C.

The heat capacity of the metal block 30 is, for example, ten times or more (18 times as an example) the heat capacity of the lid 5. For example, the thickness T of the metal block 30 is 2% or more of the perimeter of the lid 5. The perimeter of the lid 5 is a sum of twice the length of the lid 5 in the direction D1 and twice the length of the lid 5 in the direction D2. In the example above, since the perimeter of the lid 5 is 76.4 mm and 2% of the perimeter of the lid 5 is about 1.5 mm, the thickness T may be 1.5 mm or more.

Figure 10:
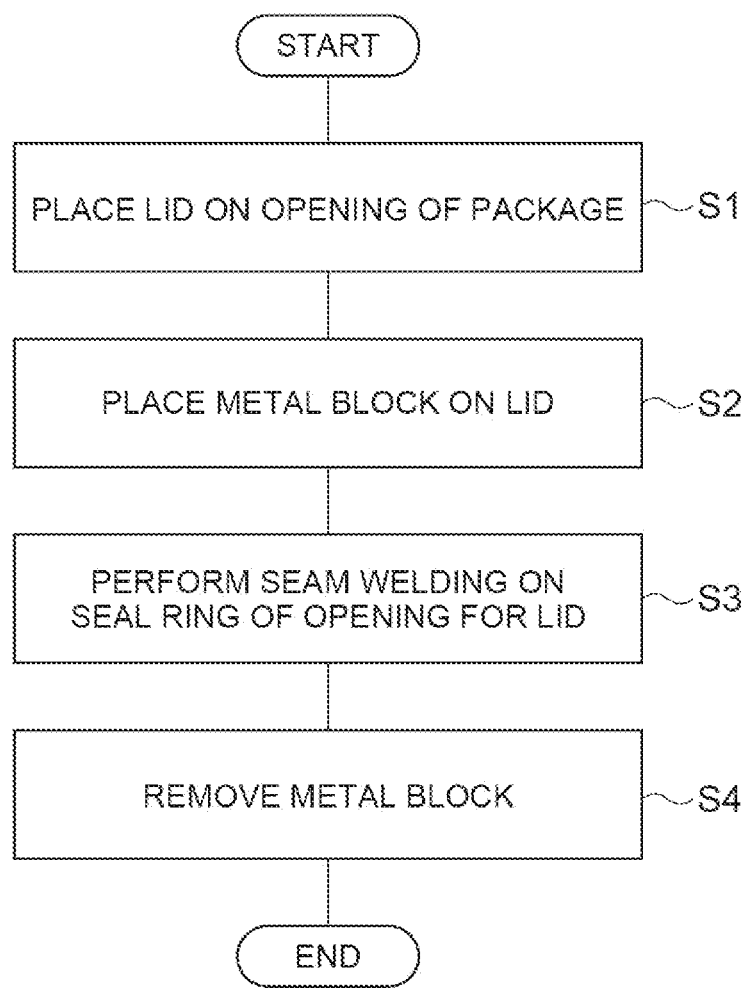
FIG. 10 is a flowchart illustrating steps of a method of manufacturing an optical module according to the embodiment.

Next, an example of processes of the method of manufacturing the optical module 1 according to this embodiment will be described with reference to FIG. 10. FIG. 10 is a flow chart illustrating the processes of the method of manufacturing the optical module 1. First, the package 2 is set on a predetermined jig. This jig is a jig for positioning the package 2 and is made of, for example, aluminum. Since the above-described welding is performed on the lid 5 and the package 2 placed on this jig, the heat can escape from the lid 5 and the package 2 to the outside via this jig. As a result, excessive temperature rise of the lid 5 and the package 2 can be suppressed.

Next, the lid 5 is placed on the opening 2C of the package 2 (process of placing the lid, step S1). At this time, the lid 5 is placed on the package 2 so as to block the opening 2C of the package 2 in the state of the top surface 5b facing upward. Then, the metal block 30 is placed on the lid 5 (process of placing the metal block, step S2). The metal block 30 is placed on the top surface 5b of the lid 5 so that the thickness direction of the metal block 30 matches the thickness direction of the lid 5. At this time, the metal block 30 is placed so that the distance K from the metal block 30 to the joint portion 5g when viewed from the direction D3 is 0.8 mm or more and 3 mm or less. In addition, the metal block 30 may be placed on the lid 5 via the flexible heat dissipation member 40. In this case, for example, the heat dissipation member 40 is attached to the first surface 31 of the metal block 30, and the metal block 30 is placed on the lid 5 by allowing the heat dissipation member 40 attached to the first surface 31 to be in contact with the top surface 5b of the lid 5.

Subsequently, the lid 5 on which the metal block 30 is placed is seam-welded to the seal ring 2e around the opening 2C (process of performing the seam welding, step S3). Specifically, the lid 5 and the package 2 on which the metal block 30 is placed are set on the stage of the welding device, and the seam welding is started. At this time, the lid 5 and the seal ring 2e are heated and melted by applying an electric current to the pair of roller electrodes 21 while pressing the pair of side surfaces 5c of the lid 5 against the seal ring 2e by the pair of roller electrodes 21, and the joint portion 5g between the lid 5 and the seal ring 2e is generated.

Figure 11:
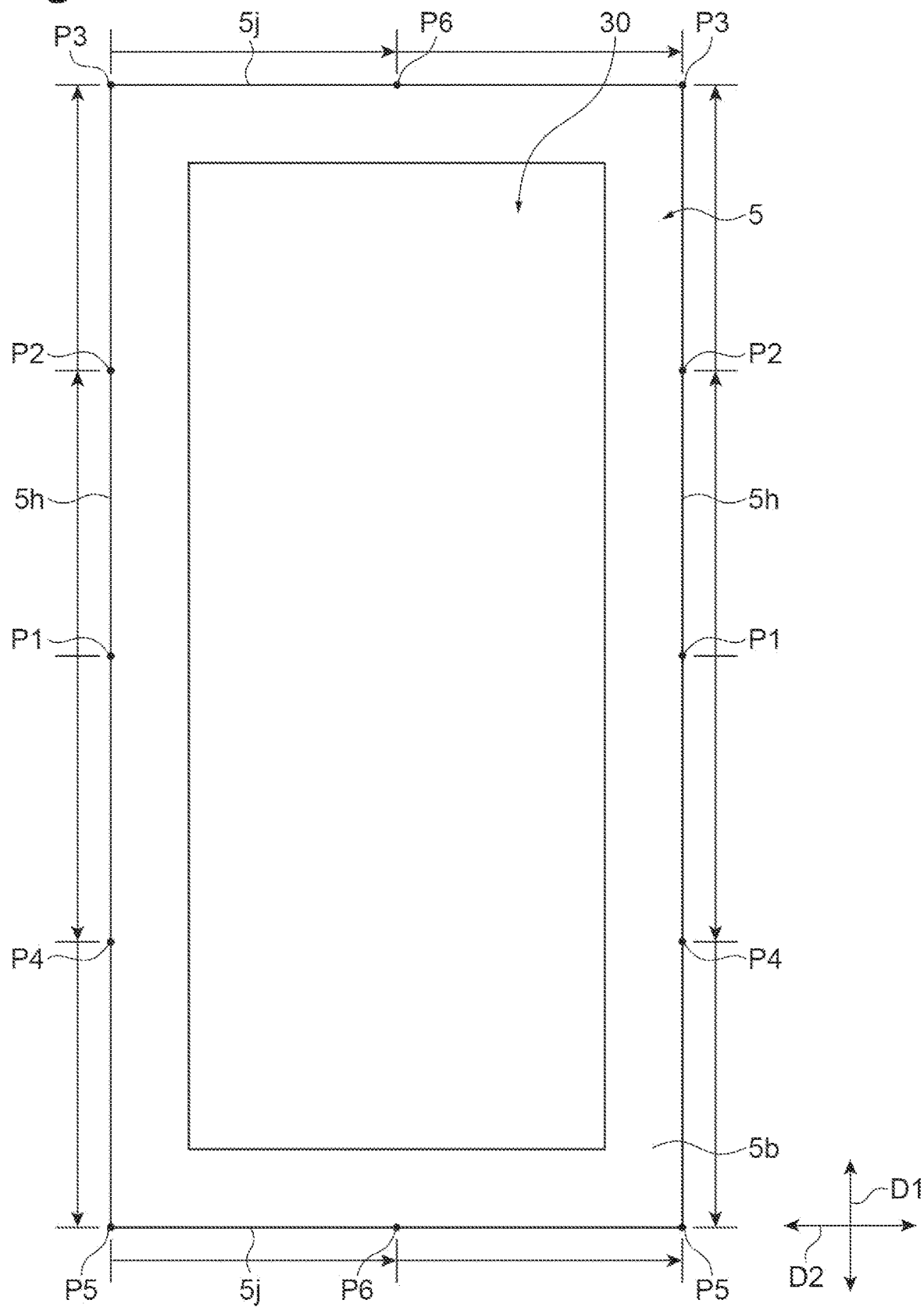
FIG. 11 is a diagram illustrating an example of a seam welding process in the method of manufacturing an optical module according to the embodiment.

FIG. 11 is a plan view of the lid 5 for describing a seam welding process. As illustrated in FIG. 11, for example, the seam welding is performed from a center P1 of a side 5h of the lid 5 toward the end portion when viewed from the direction D3. The side 5h is, for example, a long side of the lid 5. As a specific example of the seam welding, first, temporary welding (positioning) is performed at the center P1 of the side 5h. Then, the pair of roller electrodes 21 aligned in the direction D2 are welded from the center P1 to a point P2 by being moved from the center P1 to one side in the direction D1 by ¼ of the length of the side 5h.

After that, the pair of roller electrodes 21 are separated (raised) and retained from the point P2 in the direction D3 for a predetermined time (for example, 5 seconds), and the lid 5 is cooled. After the cooling, the pair of roller electrodes 21 is lowered along the direction D3 to be in contact with the point P2, the roller electrodes 21 are further moved from the point P2 to one side of the direction D1, and the welding is performed from the point P2 to one end P3 of the side 5h. Then, similarly to the above, the pair of roller electrodes 21 are separated from one end P3 in the direction D3 for a certain period of time.

Next, by returning the position of the pair of roller electrodes 21 to the center P1, the pair of roller electrodes 21 are allowed to be in contact with the lid 5 and are moved from the center P1 of the side 5h to the other side in the direction D1 by ¼ of the length of the side 5h, so that the welding is performed from the center P1 to a point P4. Similarly to the above, after the pair of roller electrodes 21 are separated (raised) from the point P4 in the direction D3 for a certain period of time, the pair of roller electrodes 21 are lowered along the direction D3 to be in contact with the point P4, the roller electrodes 21 are further moved from the point P4 to the other side of the direction D1, and the welding is performed from the point P4 to the other end P5 of the side 5h. Then, similarly to the above, the pair of roller electrodes 21 is separated from the other end P5 for a certain period of time.

Subsequently, for example, a short side 5j of the lid 5 is welded by rotating a device stage by 90° in a plane parallel to the top surface 5b with respect to the pair of roller electrodes 21. At this time, the short side 5j of the lid 5 is welded by moving the roller electrode 21 along the short side 5j of the lid 5 while applying the roller electrode 21 to each of the corners of the lid 5 aligned along the direction D1. Specifically, for example, the welding is performed from one end of the short side 5j to a center P6 of the short side, and after the pair of roller electrodes 21 are separated (raised) from the center P6 in the direction D3 for a certain period of time, the welding is performed from the center P6 to the other end of the short side. After performing the seam welding as described above, the metal block 30 is removed from the top of the lid 5 (removing process, step S4). After cooling the lid 5 and the package 2 to room temperature, a series of processes are completed by removing the lid 5 and the package 2 from the jig. It is noted that the jig on which the package 2 is set may have a movable member capable of moving in the direction D3, and the metal block 30 may be attached to the tip of the movable member. By moving the movable member up and down, the metal block 30 can be efficiently placed on and removed from the top surface 5b of the lid 5 while ensuring the distance K described above.

Next, the functions and effects obtained from the method of manufacturing the optical module 1 according to this embodiment will be described. In this manufacturing method, the lid 5 is placed on the package 2 so as to close the opening 2C, and the metal block 30 is placed on the lid 5. The lid 5 on which the metal block 30 is placed is seam-welded to the seal ring 2e around the opening 2C of the package 2. Therefore, the Joule heat generated during the seam welding can escape from the lid 5 to the metal block 30. Therefore, since the Joule heat is consumed to heat the metal block 30, and the temperature rise of the entire lid 5 can be suppressed, by suppressing the thermal expansion of the lid 5 in the directions D1 and D2, it is possible to suppress the occurrence of the warpage of the package 2 due to the residual stress of the lid 5. Since the package 2 can be allowed to be less likely to warp, it is possible to suppress a decrease in coupling efficiency of the optical signal in the optical module 1.

As described above, in the seam welding process, the joint portion 5g between the lid 5 and the seal ring 2e may be formed by the seam welding, and in the process of placing the metal block 30, when viewed from the direction D3, the metal block 30 may be placed so that the distance K from the metal block 30 to the joint portion 5g is 0.8 mm or more and 3 mm or less. When the distance K from the metal block 30 to the joint portion 5g is 0.8 mm or more, the Joule heat excessively escapes from the joint portion 5g to the metal block 30, and the fact that the temperature of the joint portion 5g does not sufficiently rise to the melting point can be reliably avoided. When the distance K from the metal block 30 to the joint portion 5g is 3 mm or less, since the Joule heat can escape to the metal block 30 having a heat capacity larger than that of the lid 5, the temperature of the joint portion 5g can be raised to the melting point or higher by the heating, so that the welding can be reliably performed and the warp of the package 2 can be reduced.

As described above, the metal block 30 may be made of copper. In this case, since the metal block 30 is made of copper having higher thermal conductivity than the lid 5, the Joule heat is more easily conducted to the metal block 30 than to the lid 5, and the temperature rise of the lid 5 can be reduced.

As described above, the metal block 30 may have a thickness T of 2 mm or more, and in the process of placing the metal block 30, the metal block 30 may be placed so that the thickness direction of the metal block 30 matches the thickness direction of the lid 5. In this case, since the heat capacity of the metal block 30 can be increased by setting the thickness T of the metal block 30 to 2 mm or more, the Joule heat conducted from the lid 5 to the metal block 30 is consumed to heat the metal block 30, and the temperature rise of the lid 5 can be reduced. As a result, warping of the package 2 can be suppressed more reliably.

Figure 12:
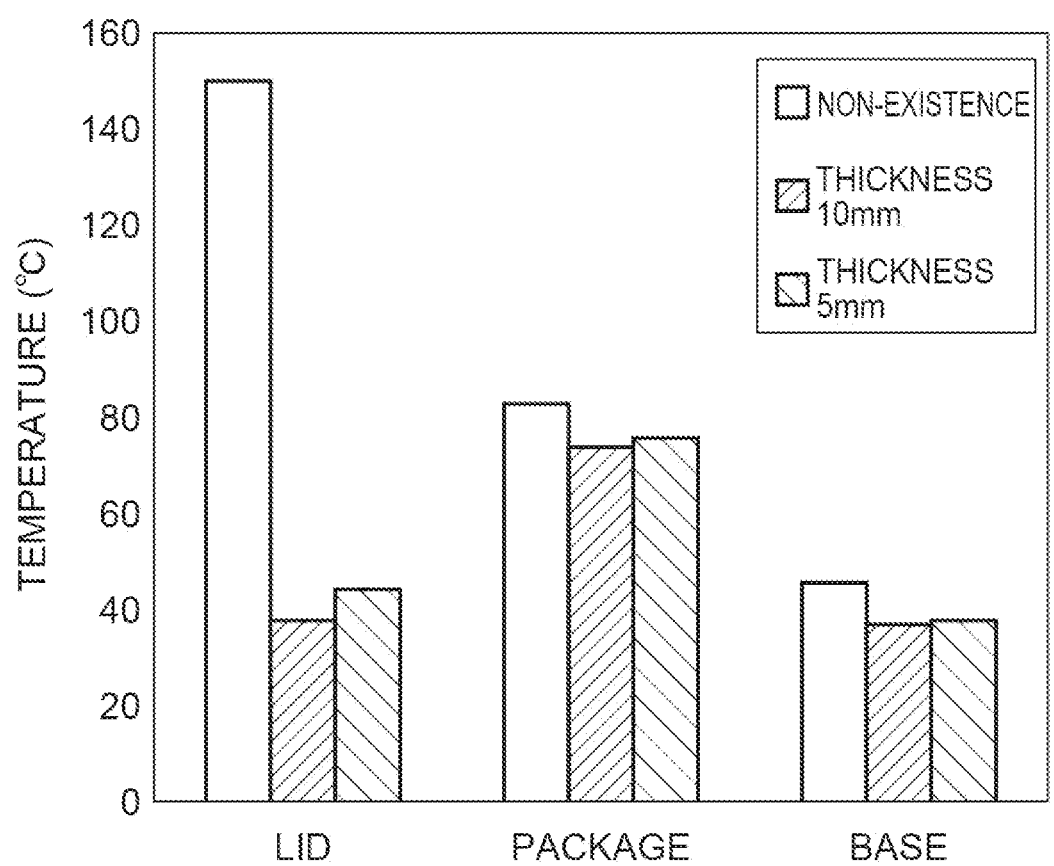
FIG. 12 is a graph illustrating measured values of temperature rise during the seam welding with and without the use of the metal blocks for the lid, the package, and the base of the optical module according to the embodiment.
Figure 13:
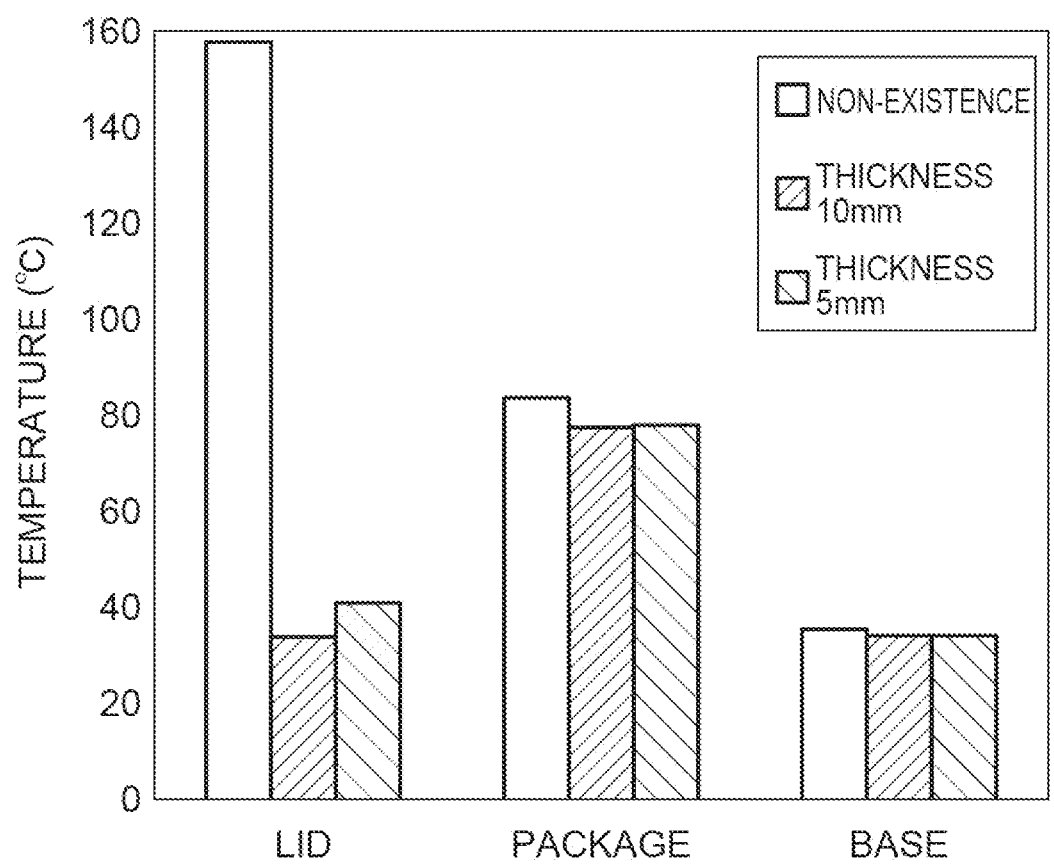
FIG. 13 is a graph illustrating analytical values of temperature rise during the seam welding with and without the use of the metal blocks of the lid, the package, and the base of the optical module according to the embodiment.

FIG. 12 is a graph illustrating measured values of temperature rise during the welding in the base (bottom wall) 2d on which the lid 5, the package 2, and the internal optical system 12 of the optical module 1 are mounted. FIG. 13 is a graph illustrating analytical values of temperature rise during the welding in the lid 5, the package 2, and the base. As illustrated in FIGS. 12 and 13, in one of the case of using the metal block 30 having a thickness T of 5 mm or the case of using the metal block 30 having a thickness T of 10 mm, it has been found that the temperature rise of the lid 5 can be suppressed to a greater extent than the case where the metal block 30 is not provided. It has been also found that, when the metal block 30 is used for the package 2 and the base, the temperature rise during the welding can be suppressed. This is probably because the Joule heat conducted to the package 2 and the base during the seam welding, but by conducting the Joule heat to the metal block 30, the Joule heat conducted to the package 2 and the base is relatively reduced. That is, it is considered that the excessive Joule heat is consumed to heat the metal block 30, and the temperature rise of not only the lid 5 but also the package 2 and the base is reduced.

As described above, in the process of placing the metal block 30, the metal block 30 may be placed via the flexible heat dissipation member 40. In this case, in comparison with the case where the metal block 30 is placed directly on the lid 5, variations in heat dissipation from the lid 5 to the metal block 30 can be suppressed. It is preferable that the heat dissipation member 40 is made of a material having good adhesion to the first surface 31 of the metal block 30 and the top surface 5b of the lid 5. For example, the heat dissipation member 40 improves adhesion to the metal surface by having flexibility. In addition, it is preferable that a front surface of the heat dissipation member 40 has few irregularities and is smooth. For example, the heat dissipation member 40 is a heat dissipation sheet or a heat dissipation gel. As a result, in comparison with the case where the metal surfaces are in contact with each other, since the heat can be more easily conducted from the lid 5 to the metal block 30, the heat contributes to further reducing the temperature rise of the lid 5. In order to conduct the heat to the metal block 30, the thermal conductivity of the heat dissipation member 40 is preferably high, and the thickness of the heat dissipation member 40 in the direction D3 is preferably small. In addition, as illustrated in FIG. 5, it is preferable that the area where the heat dissipation member 40 is in contact with the metal block 30 is equal to the area of the lower surface (first surface) of the metal block 30 facing the lid 5. The heat dissipation member 40 may have the same shape as the shape of the lower surface of the metal block 30. Accordingly, when the heat dissipation member 40 is, for example, a heat dissipation sheet, the heat dissipation member 40 can be used to be attached to the lower surface (first surface) of the metal block 30. Since the heat dissipation member is attached under the metal block 30, the attachment and detachment of the heat dissipation member 40 and the metal block 30 to the top surface 5b of the lid 5 can be performed at once, and thus, the workability is improved.

As described above, when viewed in the thickness direction (direction D3) of the lid 5 (that is, when viewed in a plan from the direction D3), the lid 5 has a rectangular shape, and in the seam welding process, the seam welding may be performed from the center P1 of the side 5h of the lid 5 toward the end portion (one end P3 or the other end P5) when viewed in the direction D3. In this case, the seam welding is performed from the center P1 of the side 5h of the lid 5 toward the end portion, so that the difference in distortion of the joint portion 5g due to the seam welding can be absorbed at the end portion of the side 5h of the lid 5. Therefore, it is possible to further reduce the possibility of leakage occurring in the welding between the seal ring 2e of the package 2 and the lid 5.

As described above, the embodiment of the method of manufacturing an optical module according to the present disclosure has been described. However, the invention is not limited to the embodiments described above. That is, it is easily recognized by those skilled in the art that the present invention can be modified and changed in various ways within the spirit of the claims.

For example, in the above-described embodiment, the example where the welding and the cooling are performed by moving the roller electrode 21 by ¼ of the length of the side 5h from the center P1 of the side 5h to the one side in the direction D1 and, after that, the welding and the cooling are performed by moving the roller electrode 21 by ¼ of the length of the side 5h from the center P1 of the side 5h to the other side in the direction D1 has been described. However, the order of the welding of the lid 5 and the seal ring 2e is not limited to the above examples. For example, the welding may be performed by moving the roller electrode 21 from one end to the other end of the side 5h. Further, in the above-described embodiment, the example in which the welding of the short sides of the lid 5 is performed after the welding of the long sides of the lid 5 has been described. In this case, the welding of the long side of the lid 5 which is severe due to the difference of the lid 5 can be performed first. However, the welding of the long sides of the lid 5 may be performed after the welding of the short sides of the lid 5, and the order of the welding is not particularly limited.

For example, in the above-described embodiments, the metal block 30, which is a copper block, has been described. However, the material of the metal block may be other than copper. For example, the metal block may be made of aluminum or an aluminum alloy.

What is claimed is:

1. A manufacturing method of an optical module including a package and a lid, the package having an opening to be sealed with the lid, the manufacturing method comprising:
   placing the lid on the package so that the lid covers the opening;
   putting a metal block on the lid, the metal block having a first surface touching a top surface of the lid;
   welding the lid to the package using a seam welding machine, the first surface of the metal block touching the top surface of the lid during the welding, the metal block being configured not to interfere with the seam welding machine; and
   detaching the metal block from the lid.

2. The manufacturing method according to claim 1,
   wherein the welding forms a joining part between the lid and the package, and
   wherein the putting the metal block includes keeping a distance between the metal block and the joining part, the distance being 0.8 mm or more and 3 mm or less in a planar view of the top surface of the lid.

3. The manufacturing method according to claim 1, wherein the metal block contains copper.

4. The manufacturing method according to claim 1, wherein the metal block has a thickness in a height direction vertical to the top surface of the lid, the thickness being 2 mm or more.

5. The manufacturing method according to claim 1, wherein the putting the metal block includes interposing a thermal conductive member between the metal block and the lid, the thermal conductive member having thermal conductivity and flexibility.

6. The manufacturing method according to claim 1,
wherein the lid has a rectangular shape in a planar view of the top surface, and
wherein the welding includes a partial welding from a center of one side of the rectangular shape to an end of the one side of the rectangular shape.

\* \* \* \* \*